(12) United States Patent
Chen et al.

(10) Patent No.: US 10,090,298 B2
(45) Date of Patent: Oct. 2, 2018

(54) INTEGRATED PACKAGING STRUCTURE

(71) Applicant: TAIWAN SEMICONDUCTOR CO., LTD., New Taipei (TW)

(72) Inventors: Chien-Chung Chen, New Taipei (TW); Sen Mao, New Taipei (TW); Hsin-Liang Lin, New Taipei (TW)

(73) Assignee: TAIWAN SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 15/447,800

(22) Filed: Mar. 2, 2017

(65) Prior Publication Data
US 2018/0211953 A1    Jul. 26, 2018

(30) Foreign Application Priority Data
Jan. 20, 2017  (TW) .............................. 106201068 U

(51) Int. Cl.
| | |
|---|---|
| *H01L 23/495* | (2006.01) |
| *H01L 27/088* | (2006.01) |
| *H01L 29/06* | (2006.01) |
| *H01L 29/417* | (2006.01) |

(52) U.S. Cl.
CPC ........ *H01L 27/088* (2013.01); *H01L 23/4952* (2013.01); *H01L 23/49503* (2013.01); *H01L 23/49562* (2013.01); *H01L 23/49586* (2013.01); *H01L 29/0634* (2013.01); *H01L 29/41725* (2013.01)

(58) Field of Classification Search
CPC ............... H01L 27/088; H01L 29/0634; H01L 29/41725; H01L 23/49562; H01L 23/49503; H01L 23/49586; H01L 23/4952; H01L 23/49537
See application file for complete search history.

(56) References Cited

U.S. PATENT DOCUMENTS

| | | | |
|---|---|---|---|
| 2008/0054422 A1* | 3/2008 | Koike | ................... H01L 21/565 257/676 |
| 2008/0173991 A1* | 7/2008 | Cruz | ................. H01L 23/49524 257/676 |

* cited by examiner

*Primary Examiner* — Su C Kim
(74) *Attorney, Agent, or Firm* — Muncy, Geissler, Olds & Lowe, P.C.

(57) ABSTRACT

An integrated packaging structure is provided. In the package structure, an integrated component body has a first source region, a second source region, a first setting region, and a second setting region, which are separated from each other. A first MOSFET die and a second MOSFET die are located on the first setting region and the second setting region respectively, and have a top surface, a source electrode pad and a gate electrode pad. The source electrode pad and the gate electrode pad are exposed from the top surface and spaced apart from each other. A first source connection element is connected to the source electrode pad of the first MOSFET die and the first source region. A second source connection element is connected to the source electrode pad of the second MOSFET die and the second source region. A gate connection element is connected to the gate electrode pad and a gate region of the integrated component body.

6 Claims, 2 Drawing Sheets

INTEGRATED PACKAGING STRUCTURE

This application claims the benefit of Taiwan Patent Application Serial No. 106201068, filed Jan. 20, 2017, the subject matter of which is incorporated herein by reference.

BACKGROUND OF INVENTION

1. Field of the Invention

The present invention is related to an integrated packaging structure, and more particularly is related to an integrated packaging structure with two dies integrated into one packaging structure.

2. Description of the Prior Art

Attending with technology development, widely use of electronic devices makes our daily lives more convenient. The power transistors, such as metal-oxide-semiconductor field-effect transistor (MOSFET), are commonly used in the electronic devices. With the advantages of high cell density and low static leakage current, the power transistors are widely used in the circuit design of electronic devices.

It has become a topic for the manufacturers to modify the design of semiconductor packaging structure for the power transistor to meet the trend of a smaller/slimmer semiconductor package. In the conventional packaging structure, if a circuit design with two or more MOSFET integrated circuits (ICs) connected with each other is needed, the two MOSFET ICs would be separately packaged and further connected with each other by using the conductive wires. The long conductive path would result in greater conductive loss, and such design would occupy a significant footprint which restricts the usage of a smaller packaging substrate.

SUMMARY OF THE INVENTION

In view of the conventional technology mentioned above, which has the problems of significant conductive loss and the difficulty to reduce the size of the packaging substrate, an integrated packaging structure is provided in the present invention, which packages two dies in the same package so as to shorten the conductive path and reduce the size of the packaging structure as well as the packaging substrate.

Accordingly, it is a main object of the present invention to provide an integrated packaging structure, which comprises an integrated circuit (IC) unit and a packaging body. The IC unit includes a main body, a first metal-oxide-semiconductor field-effect transistor (MOSFET) die, a second MOSFET die, at least one first source connection element, at least one second source connection element, at least one first gate connection element, and at least one second gate connection element. The main body has a first source region, a second source region, a first gate region, a second gate region, a first setting region, and a second setting region, which are separated from each other. The first MOSFET die is located on the first setting region, has a first upper layer, and comprises at least one first source electrode pad and at least one first gate electrode pad. The at least one first source electrode pad is exposed through the first upper layer. The at least one first gate electrode pad is spaced apart from the at least one first source electrode pad and is also exposed through the first upper layer.

The second MOSFET die is located on the second setting region, has a second upper layer, and comprises at least one second source electrode pad and at least one second gate electrode pad. The at least one second source electrode pad is exposed through the second upper layer. The at least one second gate electrode pad is spaced apart from the at least one second source electrode pad, and is also exposed through the second upper layer. The at least one first source connection element is connected to the at least one first source electrode pad and the first source region. The at least one second source connection element is connected to the at least one second source electrode pad and the second source region. The at least one first gate connection element is connected to the at least one first gate electrode pad and the first gate region. The at least one second gate connection element is connected to the at least one second gate electrode pad and the second gate region. The packaging body at least partially covers the IC unit. Wherein, the first MOSFET die and the second MOSFET die are super junction MOSFET dies.

In accordance with an embodiment of the present invention, the first source region includes at least one first source pin, the second source region includes at least one second source pin, the first gate region includes at least one first gate pin, the second gate region includes at least one second gate pin, and the at least one first gate pin, the at least one first source pin, the at least one second source pin, and the at least one second gate pin are arranged along a direction in a serial.

In accordance with an embodiment of the present invention, the at least first source connection element and the at least one second source connection element are one-piece metal clips, and the at least first gate connection element and the at least one second gate connection element are at least one conductive wire. In addition, the first source region is adjacent to the second source region, and a distance, which is greater than 1.805 mm, is left between the first setting region and the second setting region.

In accordance with an embodiment of the present invention, the at least first source connection element and the at least one second source connection element are at least one conductive wire.

By using the technology of the common-source packaging structure provided in accordance with the present invention, because the two MOSFET dies are integrated into one single packaging body, conductive loss can be effectively reduced and the size of the packaging substrate can be also effectively reduced.

In addition, by using the technology of the common-source packaging structure provided in accordance with the present invention, if two or more gate electrode pads are used, the gate electrode pads may be arranged at the corners of the MOSFET die so as to increase IC layout flexibility in practice.

BRIEF DESCRIPTION OF THE DRAWINGS

The present invention will now be specified with reference to its preferred embodiment illustrated in the drawings, in which.

DESCRIPTION OF THE PREFERRED EMBODIMENT

There are various embodiments of the integrated packaging structure provided in accordance with the present invention, which are not repeated hereby. Only one preferred embodiments is mentioned in the following paragraph as an example.

Figure 1:
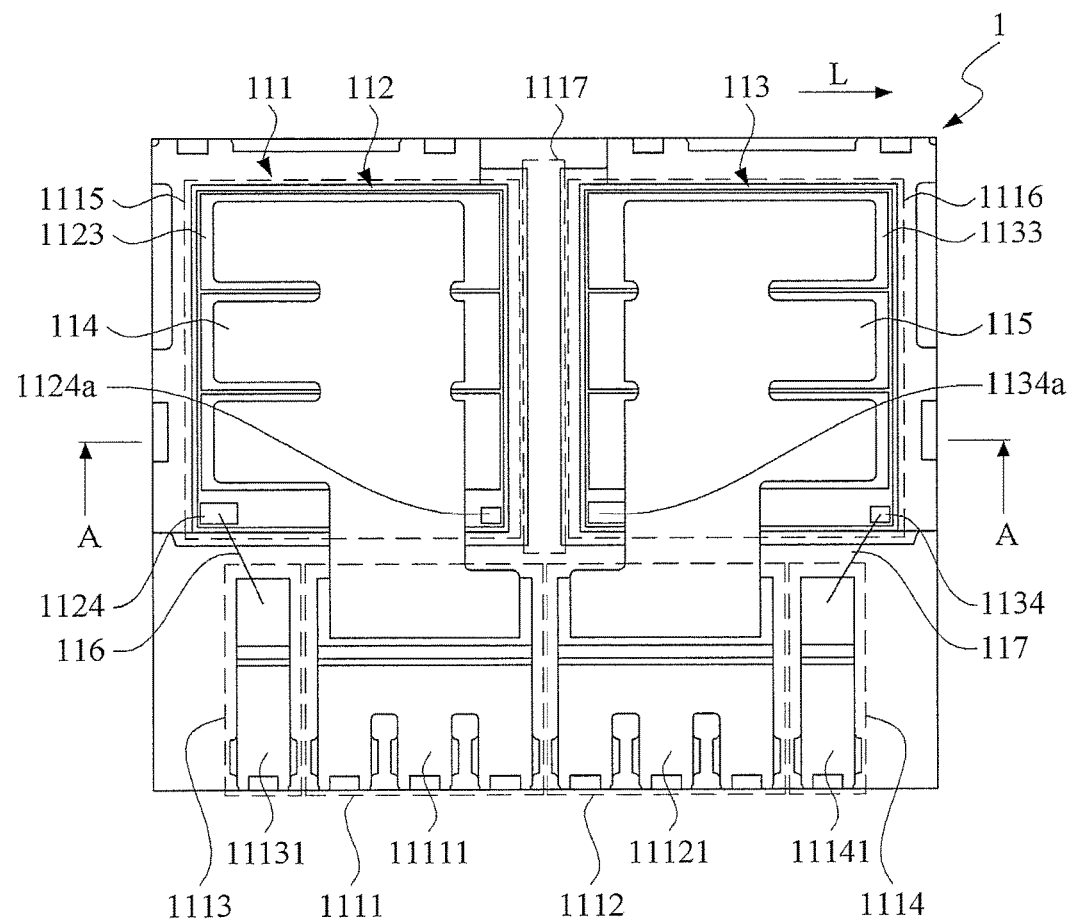
FIG. 1 is a top view of an integrated packaging structure provided in accordance with a preferred embodiment of the present invention.
Figure 2:
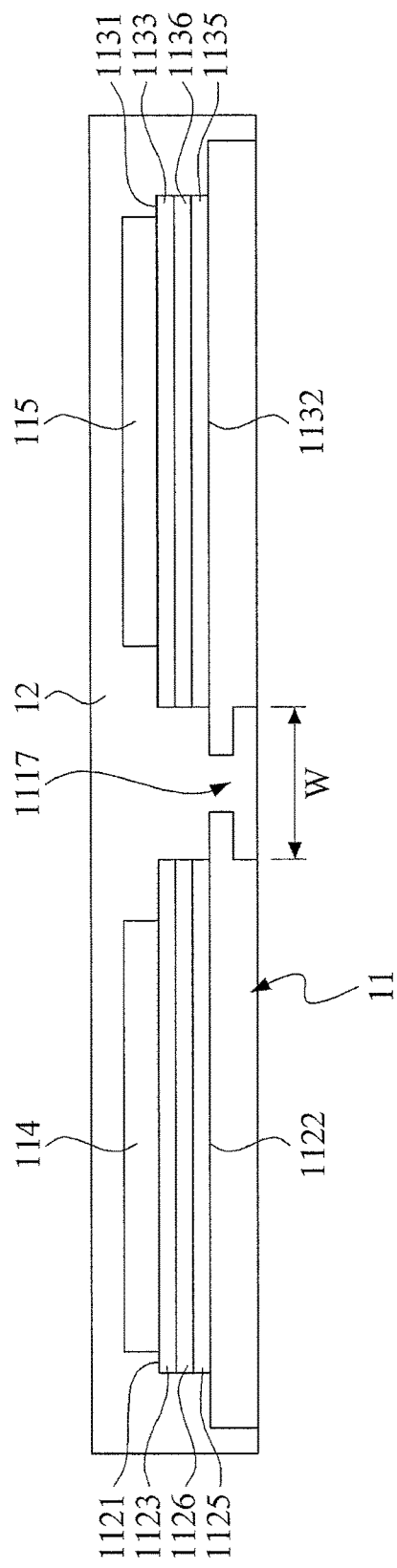
FIG. 2 is a cross-section view of the integrated packaging structure provided in accordance with the preferred embodiment of the present invention.

Please refer to FIG. 1 and FIG. 2, wherein FIG. 1 is a top view of an integrated packaging structure provided in accordance with a preferred embodiment of the present invention, and FIG. 2 is a cross-section view of the integrated packaging structure provided in accordance with the preferred embodiment of the present invention.

As shown, the integrated packaging structure 1 provided in accordance with a preferred embodiment of the present invention comprises an integrated circuit (IC) unit 11 and a packaging body 12. The IC unit 11 includes a main body 111, a first metal-oxide-semiconductor field-effect transistor (MOSFET) die 112, a second MOSFET die 113, at least one first source connection element 114, at least one second source connection element 115, at least one first gate connection element 116, and at least one second gate connection element 117.

The main body 111, such as a lead frame, has a first source region 1111, a second source region 1112, a first gate region 1113, a second gate region 1114, a first setting region 1115, a second setting region 1116, which are separated from each other, and the main body also has an isolation region 1117. The first source region 1111 includes at least one first source pin 11111 (three pins are shown in the figure and one of them is labelled), the second source region 1112 is adjacent to the first source region 1111, and the second source region 1112 includes at least one second source pin 11121 (three pins are shown in the figure and one of them is labelled).

The first gate region 1113 includes at least one first gate pin 11131 (only one is shown in the figure), the second gate region 1114 includes at least one second gate pin 11141 (only one is shown in the figure). The at least one first gate pin 11131, the at least one first source pin 11111, the at least one second source pin 11112, and the at least one second gate pin 11141 are arranged along a direction L in a serial so as to have the source pins and the gate pins showing the arrangement of bilateral symmetry. It would facilitate the research and development personnel to design the layout of the wires connected to the source electrode pad (the detail would be described in the following paragraphs).

The first setting region 1115 and the second setting region 1116 are opposite to each other through the isolation region 1117. That is, the first setting region 1115 and the second setting region 1116 are separated from each other. The isolation region 1117 may be filled with epoxy. A relatively large distance W is left in the isolation region 1117, i.e. between the first setting region 1115 and the second setting region 1116. For example, the distance W may be greater than 1.805 mm to enhance the withstanding voltage (up to 600V for example), however, the present invention is not so restricted. For example, if the distance W is further increased to 3.025 mm, the withstanding voltage can be enhanced to 1000V. That is, the withstanding voltage can be changed by adjusting the distance W (in general, the value of the withstanding voltage is proportional to the distance W), and thus the present invention is not restricted to the aforementioned examples.

The first MOSFET die 112 is located on the first setting region 1115, has a first upper layer 1121 and a first lower layer 1122, and includes at least one first source electrode pad 1123 (three pads are shown in the figure, and one of them is labelled), at least one first gate electrode pad (two electrode pads 1124 and 1124a are shown), at least one drain electrode pad 1125, and at least one first semiconductor structure 1126.

The at least one first source electrode pad 1123 is exposed through the first upper layer 1121. The first gate electrode pads 1124 and 1124a are spaced apart from the at least one first source electrode pad 1123 and is also exposed through the first upper layer 1121. The first gate electrode pads 1124 and 1124a are arranged at the corresponding corners (the lower-left corner and the lower-right corner in the figure), however, the present invention is not so restricted. In addition, the at least one first drain electrode pad 1125 is exposed through the first lower layer 1122. The first semiconductor structure 1126 is located between the first source electrode pad 1123 and the first drain electrode pad 1125. The first semiconductor structure 1126 is composed of the conventional circuit architecture, and thus is not repeated here.

The second MOSFET die 113 is located on the second setting region 1116, has a second upper layer 1131 and a second lower layer 1132, and includes at least one second source electrode pad 1133 (three electrode pads are shown in the figure, and one of them is labelled), at least one second gate electrode pad (two electrode pads 1134 and 1134a are shown), at least one second drain electrode pad 1135, and a second semiconductor structure 1136.

The at least one second source electrode pad 1133 is exposed through the second upper layer 1131. The second gate electrode pads 1134 and 1134a are spaced apart from the at least one second source electrode pad 1133 and is exposed through the second upper layer 1131. The second gate electrode pads 1134 and 1134a are arranged at the corresponding corners (the lower-left corner and the lower-right corner in the figure), however, the present invention is not so restricted. In addition, the at least one second drain electrode pad 1135 is exposed through the second lower layer 1132. The second semiconductor structure 1136 is located between the second source electrode pad 1133 and the second drain electrode pad 1135. The second semiconductor structure 1136 is composed of the conventional circuit architecture, and thus is not repeated here.

The first MOSFET die 112 and the second MOSFET die 113 of the present embodiment, are super-junction MOSFET dies featuring the super junction technology, however, the present invention is not so restricted.

The at least one first source connection element 114 (several connection elements are shown in the figure and only one of them is labelled) is connected to the at least one first source electrode pad 1123 and the at least one first source pin 11111 in the first source region 1111.

The at least one second source connection element 115 (several connection elements are shown in the figure and only one of them is labelled) is connected to the at least one second source electrode pad 1133 and the at least one second source pin 11112 in the second source region 1112.

In the present preferred embodiment, the at least first source connection element 114 and the at least one second source connection element 115 are one-piece metal clips, however, the present invention is not so restricted. The conductive wires fabricated by using the wire-bonding process can also be used in the present invention.

The at least one first gate connection element 116 is connected to the first gate electrode pad 1124 and the first gate pin 11131 in the first gate region 1113, and the at least one first gate connection element 116 is a conductive wire.

The at least one second gate connection element 117 is connected to the second gate electrode pad 1134 and the second gate pin 11141 in the second gate region 1114, and the at least one second gate connection element 117 is also a conductive wire, however, the present invention is not so restricted. The packaging body 12 at least partially covers the IC unit 11. The usage of the packaging body 12 is common to those skilled in the art and thus is not repeated here.

In sum, by using the technology of the integrated packaging structure provided in accordance with the present invention, because the two MOSFET dies are packaged into one single packaging body, conductive loss can be effectively reduced to generate a stable output and the size of the packaging substrate can also be effectively reduced. In addition, if two or more gate electrode pads are used, the gate electrode pads may be arranged at the corresponding corners of the MOSFET dies so as to increase IC layout flexibility in practice.

While the present invention has been particularly shown and described with reference to a preferred embodiment, it will be understood by those skilled in the art that various changes in form and detail may be without departing from the spirit and scope of the present invention.

What is claimed is:

1. An integrated packaging structure, comprising:
   an integrated circuit (IC) unit, comprising:
      a main body, having a first source region, a second source region, a first gate region, a second gate region, a first setting region, and a second setting region, which are separated from each other;
      a first metal-oxide-semiconductor field-effect transistor (MOSFET) die, located on the first setting region, having a first upper layer, and comprising:
         at least one first source electrode pad, exposed through the first upper layer; and
         two first gate electrode pads, spaced apart from the at least one first source electrode pad, and exposed through the first upper layer;
      a second MOSFET die, located on the second setting region, having a second upper layer, and comprising:
         at least one second source electrode pad, exposed through the second upper layer; and
         two second gate electrode pads, spaced apart from the at least one second source electrode pad, and exposed through the second upper layer;
      at least one first source connection element, connected to the at least one first source electrode pad and the first source region;
      at least one second source connection element, connected to the at least one second source electrode pad and the second source region;
      at least one first gate connection element, connected to the two first gate electrode pads and the first gate region; and
      at least one second gate connection element, connected to the two second gate electrode pads and the second gate region; and
   a packaging body, at least partially covering the IC unit;
   wherein the first MOSFET die and the second MOSFET die are super junction MOSFET dies;
   wherein the first source region includes at least one first source pin, the second source region includes at least one second source pin, the first gate region includes at least one first gate pin, the second gate region includes at least one second gate pin, and the at least one first gate pin, the at least one first source pin, the at least one second source pin, and the at least one second gate pin are arranged along a direction in a serial;
   wherein the first gate electrode pads are arranged at corresponding corners of the first MOSFET die and the second electrode pads are arranged at corresponding corners of the second MOSFET die.

2. The integrated packaging structure of claim 1, wherein the at least first one source connection element and the at least one second source connection element are one-piece metal clips.

3. The integrated packaging structure of claim 1, wherein the at least first source connection element and the at least one second source connection element are at least one conductive wire.

4. The integrated packaging structure of claim 1, wherein the at least first gate connection element and the at least one second gate connection element are at least one conductive wire.

5. The integrated packaging structure of claim 1, wherein the first source region is adjacent to the second source region.

6. The integrated packaging structure of claim 1, wherein a distance is left between the first setting region and the second setting region, and the distance is greater than 1.805 mm.

* * * * *